United States Patent [19]
Coffee et al.

[11] Patent Number: 5,860,281
[45] Date of Patent: Jan. 19, 1999

[54] THERMOELECTRIC COOLER AND WARMER FOR FOOD WITH TABLE TOP TRAY

[75] Inventors: Stephen L. Coffee; James J. J. Costello; Winthrop A. Eastman; Laurence R. Giles; Jonathan H. Godshall; Eve Heim-Grubb; Ninh G. Pham, all of Houston, Tex.

[73] Assignee: Igloo Products Corporation, Houston, Tex.

[21] Appl. No.: 800,422

[22] Filed: Feb. 14, 1997

[51] Int. Cl.[6] .............................. F25B 21/02; F25D 25/00; A47B 88/00
[52] U.S. Cl. ............................ 62/3.62; 62/457.9; 62/258; 62/377; 312/317.3; 312/298
[58] Field of Search ............................ 62/3.6, 3.61, 3.62, 62/457.7, 457.9, 258, 326, 331, 377; 220/592.03, 212, 694; 312/405, 405.1, 408, 317.3, 313, 277, 298, 240

[56] References Cited

U.S. PATENT DOCUMENTS

| | | | |
|---|---|---|---|
| Re. 32,740 | 8/1988 | Steffes | 312/351 |
| D. 349,007 | 7/1994 | Costello | D7/605 |
| D. 352,420 | 11/1994 | Costello | D7/350 |
| 4,320,626 | 3/1982 | Donnelly | 62/3.64 |
| 4,515,421 | 5/1985 | Steffes | 312/351 |
| 4,889,257 | 12/1989 | Steffes | 220/331 |
| 5,301,508 | 4/1994 | Kahl et al. | 62/362 |
| 5,319,937 | 6/1994 | Fritsch et al. | 62/362 |
| 5,379,596 | 1/1995 | Grayson | 62/3.62 |
| 5,660,296 | 8/1997 | Greenwich | 220/326 |

*Primary Examiner*—William Doerrler
*Attorney, Agent, or Firm*—Pillsbury Madison & Sutro, LLP

[57] ABSTRACT

A container useful for keeping food or beverages warm or cold includes a combination lid and tray door assembly. The lid and tray are both coupled to the container and to each other. The tray may be pivoted independently of the lid into a table top position and it may be separated from the container and used as a separate tray. The tray and lid are also pivotable together as an integral door assembly, and the lid is pivotable independently of the tray when the tray is removed or deployed as a table top. The overall height of the container is less than the overall length and the overall width so that the container has a low, stable center of gravity which permits it to be used on an unstable surface, such as an automobile seat, and so that the container does not obstruct movement or view of occupants of an automobile when it is used in an automobile. A handle of the container includes a holder for wrapping a power cord thereon, and, when disposed in a downward stowed position, provides a clearance between the bottom of the door and a supporting surface when the container is turned on its side to be used as a front opening cooler or warmer. The thermoelectric engine of the cooler/warmer is constructed as an integral cassette which can be installed or removed from the main body of the container in one piece. Finally, a finned heat sink used in the thermoelectric engine in conjunction with a centrifugal fan is formed as an oblique parallelogram to produce uniform air flow velocity across the width of the heat sink.

24 Claims, 15 Drawing Sheets

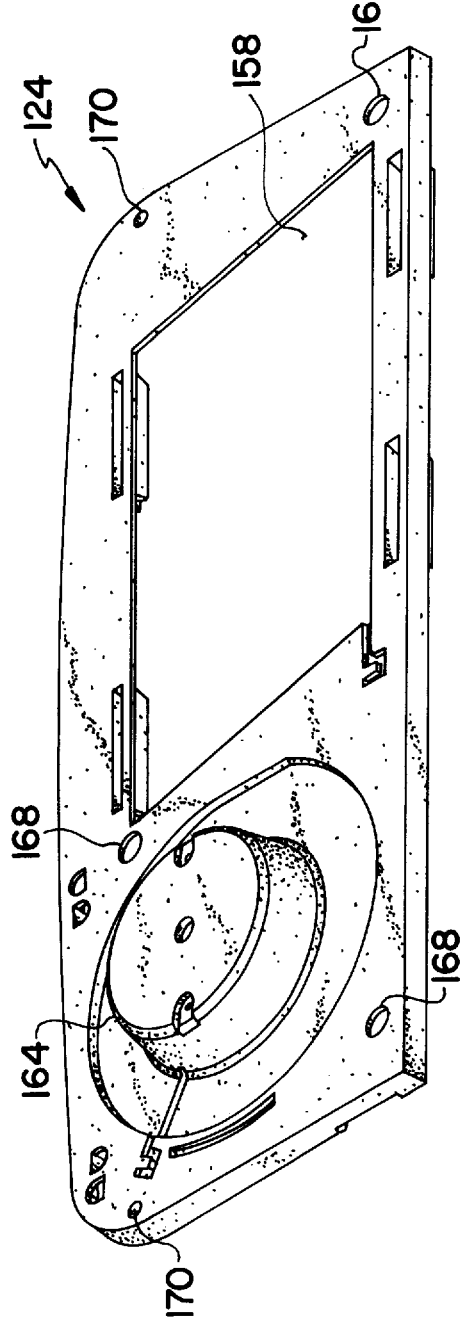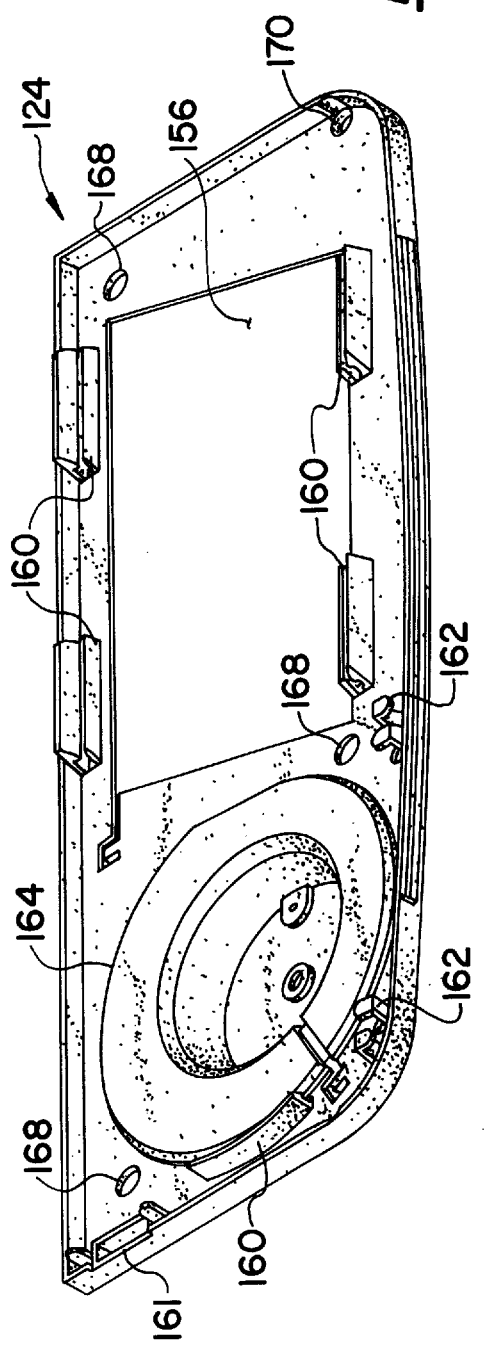

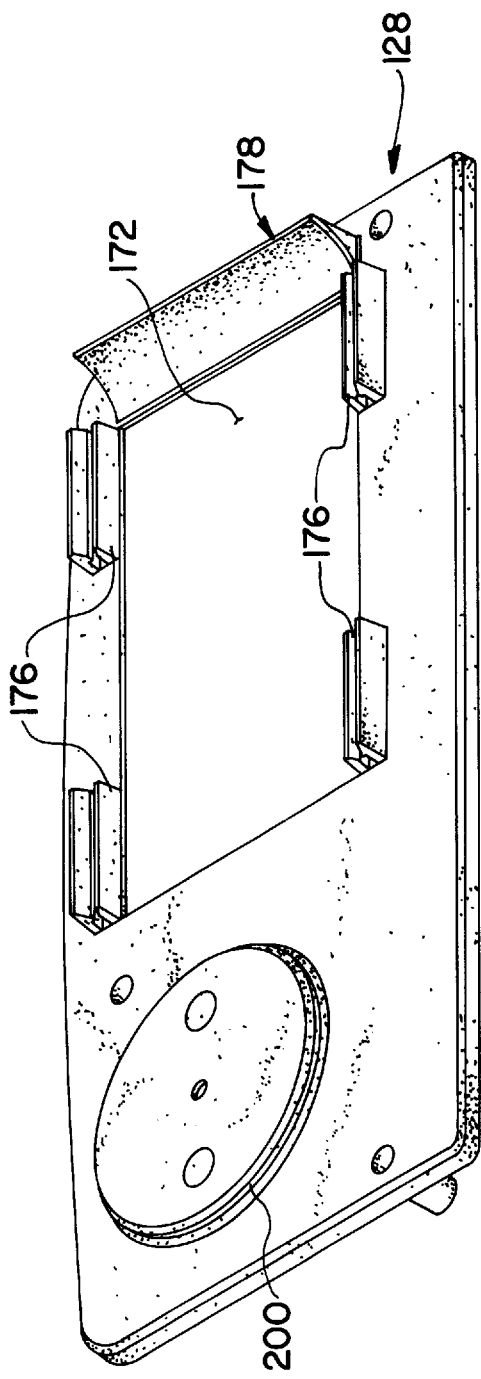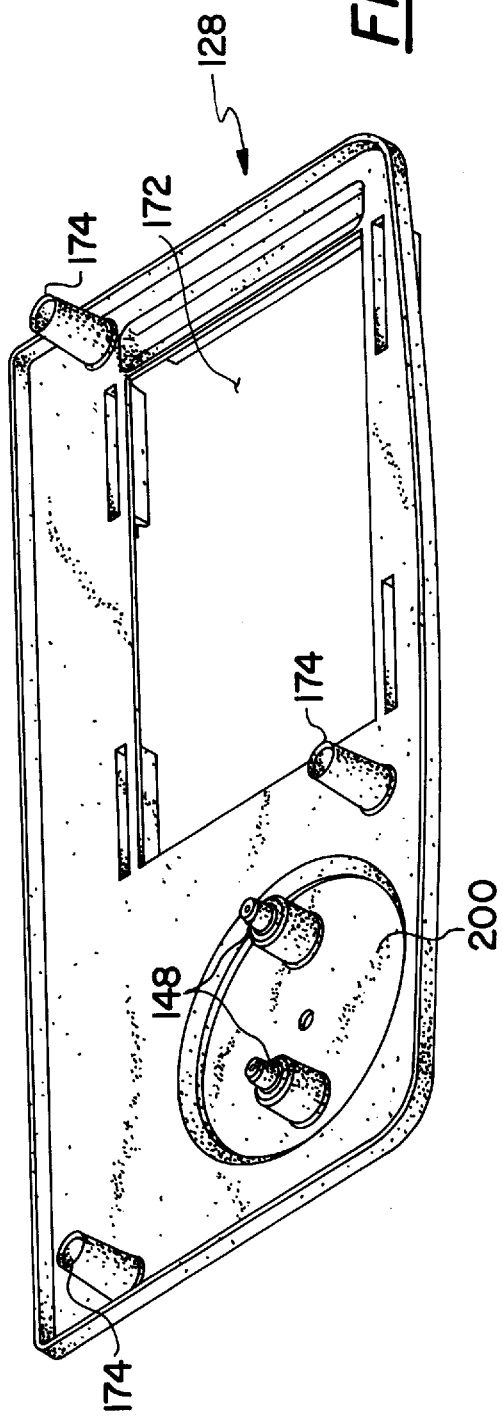

THERMOELECTRIC COOLER AND WARMER FOR FOOD WITH TABLE TOP TRAY

BACKGROUND OF THE INVENTION

1. Field of the Invention

The present invention relates to an improved container, which can be selectively used as a cooler or warmer for food and beverages. More particularly, the present invention relates to a portable container having one or more characteristics that adapt it for use in a motor vehicle and/or dorm room, facilitate its assembly and repair, and/or facilitate its efficient operation.

2. Description of the Related Art

Coolers are typically in the form of an insulated container which has walls upstanding from a base to define a top opening to which a removable cover is mounted. Thus, such coolers are typically rectangular with two sidewalls and two end walls, and have a pivotal handle assembly mounted to each end wall for carrying the cooler. As such, conventional coolers are intended to be disposed solely on the bottom or back wall, and the lid, whether or not hinged along one edge, is simply interlocked with the container by a friction fit and/or by engagement with pivotally mounted locking carrying handles which selectively engage and hold the lid on the container.

Typically coolers of the type described above are used as ice chests. Thus, when the food and/or beverages are to be kept cool, they are placed in the container and ice is added to the container to keep the food cool. Such ice chests have a number of disadvantages. For example, as the ice melts, water will be present in the base of the container and must be periodically removed. Often, outlet ports are provided in such coolers to allow the melted ice to be drained. Still, for the most part, only hermetically sealed containers can be placed within the container if water damage is to be avoided. Further, to keep the contents cool for an extended period, ice must be repeatedly added.

Furthermore, because ice is required to keep the food and beverages cool, only a relatively small amount of food can actually be stored within a cooler of a given size and the weight of the cooler is significantly increased by the presence of the ice.

It has been proposed to incorporate within a cooler type container a cooling system so that when the container is coupled to a power source, food and beverages within the cooler will be automatically cooled. With such automatic cooling, there is no need for ice, and thus the container can hold more food and beverages than conventional ice chests of comparable size. The thermoelectric technology which allows a cooling system to be incorporated in a cooler was, to a significant extent, developed by NASA and eliminates the need for bulky compressors and piping. Furthermore, as an alternative to cooling, such newly developed systems can be used to warm foods by reversing the polarity of the power to the system. Because such alternative cooling/heating systems are known a detailed disclosure of the heating/cooling system is omitted herein.

With the advent of positive cooling or warming within a portable container, there has been a desire to provide a portable food container which can be used both in a conventional ice chest orientation with the lid or door on top and in an end up orientation as a "college dorm room", hotel, or office refrigerator/warming oven with a front opening door. A structure of this type is described in U.S. Pat. No. 5,319,937, the disclosure of which is hereby incorporated by reference.

While portable cooling/warming containers, such as that described in the aforementioned '937 patent, have a number of advantages, that is not to say the improvement thereof is not possible. For example, when a cooler or warmer is used as a top opening ice chest, the cooler itself provides no tray or table top structure other than the top of the top opening lid. Obviously, it is not possible to open the lid while food, beverages, or other items are setting thereupon without displacing the items. Furthermore, when such a thermoelectric unit is used in a motor vehicle, it typically presents an inconvenient and sometimes dangerous interference with passengers or the driver because of the height of the unit and is subject to tipping because of the high center of gravity thereof. In addition, thermoelectric cooler/warmers adapted for use in motor vehicles will typically have a long power cord so that the cooler/warmer may be used in the back seat of a car or in the back of a van while plugged into a cigarette lighter receptacle in the dashboard of the vehicle. It is desirable to have a means for stowing the cord when not in use or stowing excess cord when less than the whole length of cord is needed. One proposal includes cleats for wrapping the cord thereon located within a recess on a lower rear portion of the container. The cleats are not easily accessible and, because they are built within a recess formed on the main body of the container, introduce manufacturing complexities that raise manufacturing costs.

Another problem encountered with thermoelectric cooling/warming units is that the components of the thermoelectric unit (often known collectively as the "thermoelectric engine") are built into portions of the body and/or lid of the cooling/warming unit. Therefore, insertion, removal, and repair of the thermoelectric components comprising the thermoelectric engine can be difficult from a manufacturing and maintenance standpoint. Finally, it is always desirable to maximize the efficiency of a thermoelectric engine, such as that used in a cooling/warming unit.

SUMMARY OF THE INVENTION

It is an object of the present invention to provide a thermoelectric cooler/warmer which overcomes the shortcomings of conventional thermoelectric units set forth above.

This object is achieved by providing a container having a main body and a door assembly which includes a tray and a lid which separably engage one another and the main body of the container. The tray is engaged with the container in such a way that (1) it can be pivoted 180° so as to be movable between a stowed position in which it engages the lid and a deployed position so as to be usable as a fixed table top surface, (2) the lid can be opened independently of the tray so that it can be opened when the tray is deployed as a table top surface, or (3) the tray can remain engaged with the lid while the lid is opened from the container. The tray is removably attached to the lid so that it can be removed from the lid and used at a location distant from the container, such as on the lap of an automobile occupant to hold food and beverage or to write thereon.

This object is also achieved by providing a container having a low height relative to the length and width of the container so that it can be disposed on the seat of a car and remain thereat without obstructing the movement or view of the occupants of the car and so that it can be conveniently used, e.g., taking advantage of the tray and lid features described above.

This object is also achieved by providing the container with a handle that includes a cord stowing holder so that an electrical cord can be conveniently wrapped around the holder. Because the holder is located on the handle, it is easily accessible and easily manufacutered.

This object is also achieved by providing a container having a handle and at least one projecting rib on the side of the box designed so that, with the handle in a downward stowed position, the container can be set on its side, resting in a level, stabilized position on a portion of the handle and on the side rib, and used as a front-opening refrigerator or warmer. The clearance between the bottom edge of the front-opening door and the supporting surface afforded by the handle and rib permit the door to swing open and closed without scraping the supporting surface.

This object is also achieved by providing a thermoelectric engine and housing designed as a "cassette" which can be easily inserted and removed from the container as a single unit by means of several screws or other suitable attachment means. This facilitates assembly, repair, and/or replacement of the thermoelectric engine with a minimum amount of labor and without unnecessary replacement of other parts of the container.

It is another object of the present invention to improve the efficiency of a thermoelectric unit, such as the type used in a cooler/warmer container. This object is achieved by providing in the thermoelectric engine a finned heat sink having an intake end shaped to facilitate more efficient and uniform movement of air through the heat sink, thus improving the efficiency of heat transfer from the heat sink body to the air flow.

These and other objects, features, and characteristics of the present invention as well as the methods of operation and functions of the related elements of structure, and the combination of parts and economies of manufacture, will become more apparent upon consideration of the following description and the appended claims with reference to the accompanying drawings, all of which form a part of this specification, wherein like reference numerals designate corresponding parts in the various figures.

BRIEF DESCRIPTION OF THE DRAWINGS

FIGS. 12A and 12B are the bottom and top, respectively, of an outer plate of the thermoelectric engine cassette;

FIGS. 12C and 12D are the bottom and top, respectively, of an inner plate of the thermoelectric engine cassette;

DETAILED DESCRIPTION OF THE PREFERRED EMBODIMENT

Figure 1:
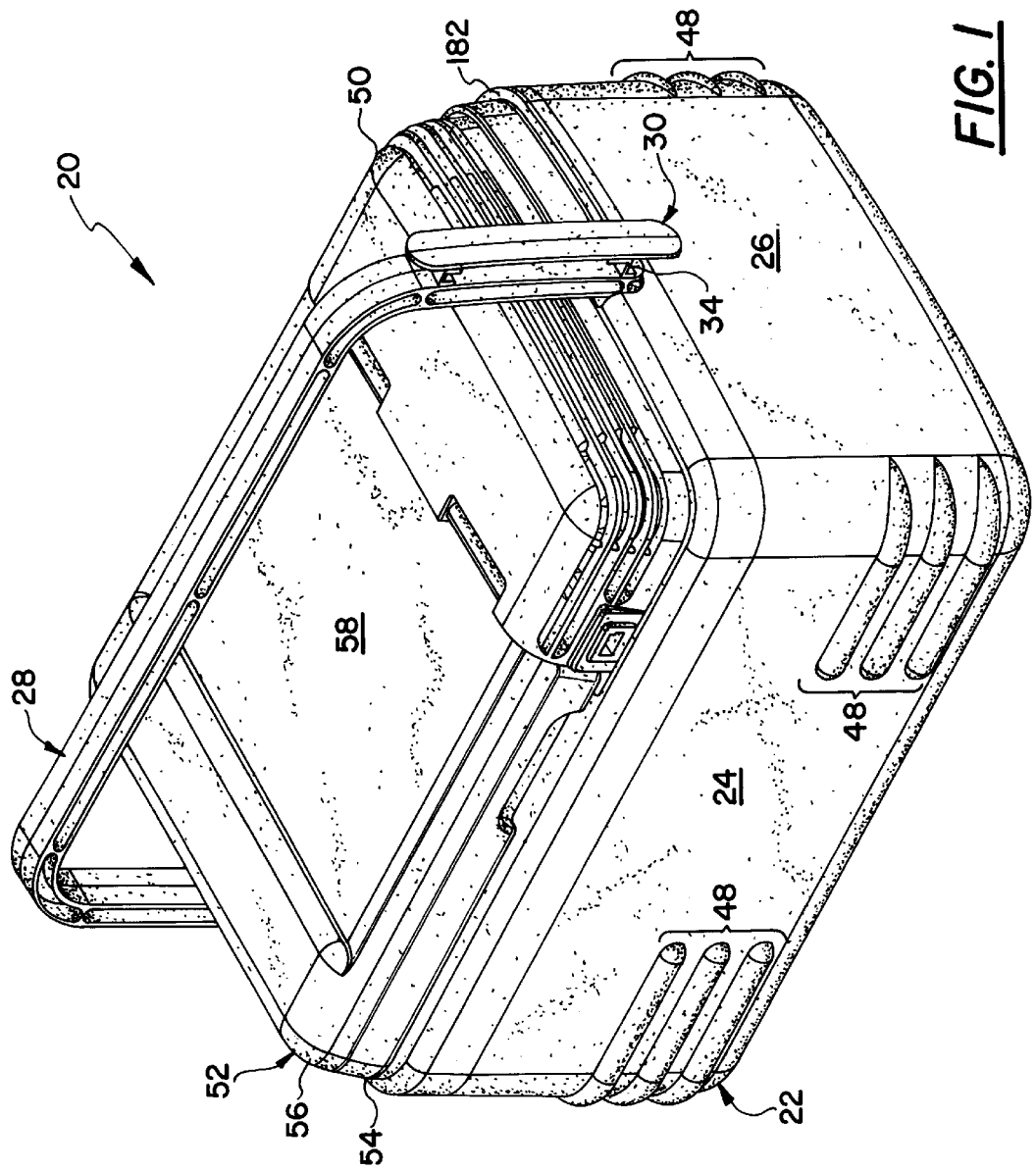
FIG. 1 is a perspective view of the heater/warmer of the present invention with the handle shown upright in an operative carrying position.

A portable cooler/warmer according to the present invention is generally designated by reference number 20 in FIG. 1. As shown in FIGS. 1–10 the cooler/warmer 20 includes a main body 22 which comprises four sidewalls 24, 26, 44 and 46 extending upwardly from a base wall 60 (see e.g., FIGS. 4 and 5). Base wall 60 and sidewalls, 24, 26, 44, and 46 define compartment 62. Front and back sidewalls 24 and 46 each include a plurality of ribs 48 while end walls 26 and 44 are preferably, but not necessarily, devoid of rib structures. It will be appreciated that designation of a sidewall as either a front, back, or end wall is purely for purposes of convenience in the description of the main body 22.

The side and base walls of the main body 22 are preferably formed of a molded plastic material, such as polypropylene. In addition, the sidewalls and base wall are preferably insulated in a conventional manner.

Figure 3:
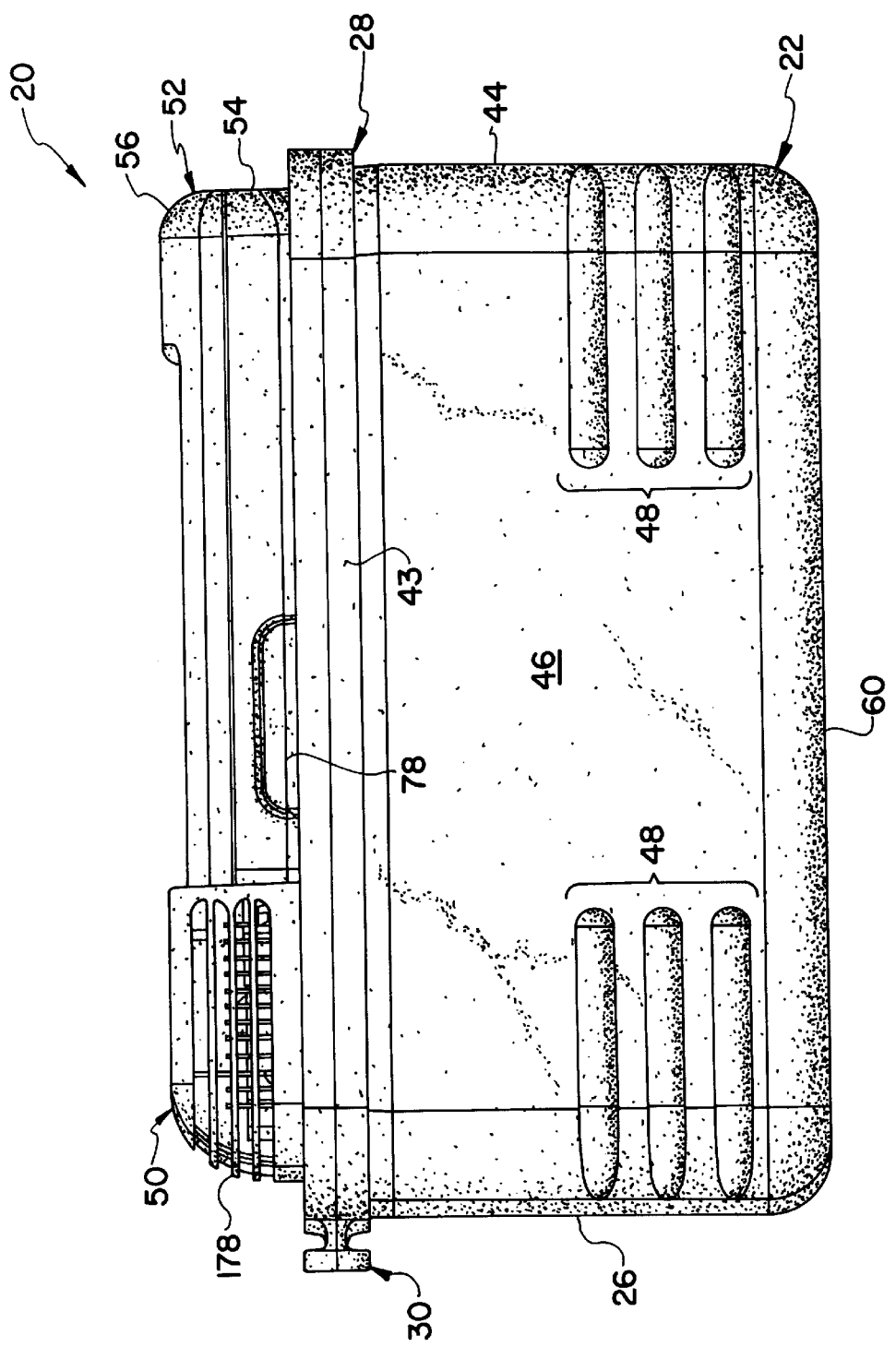
FIG. 3 is a front elevation of the cooler/warmer of the present invention with the handle in the stowed position.
Figure 4:
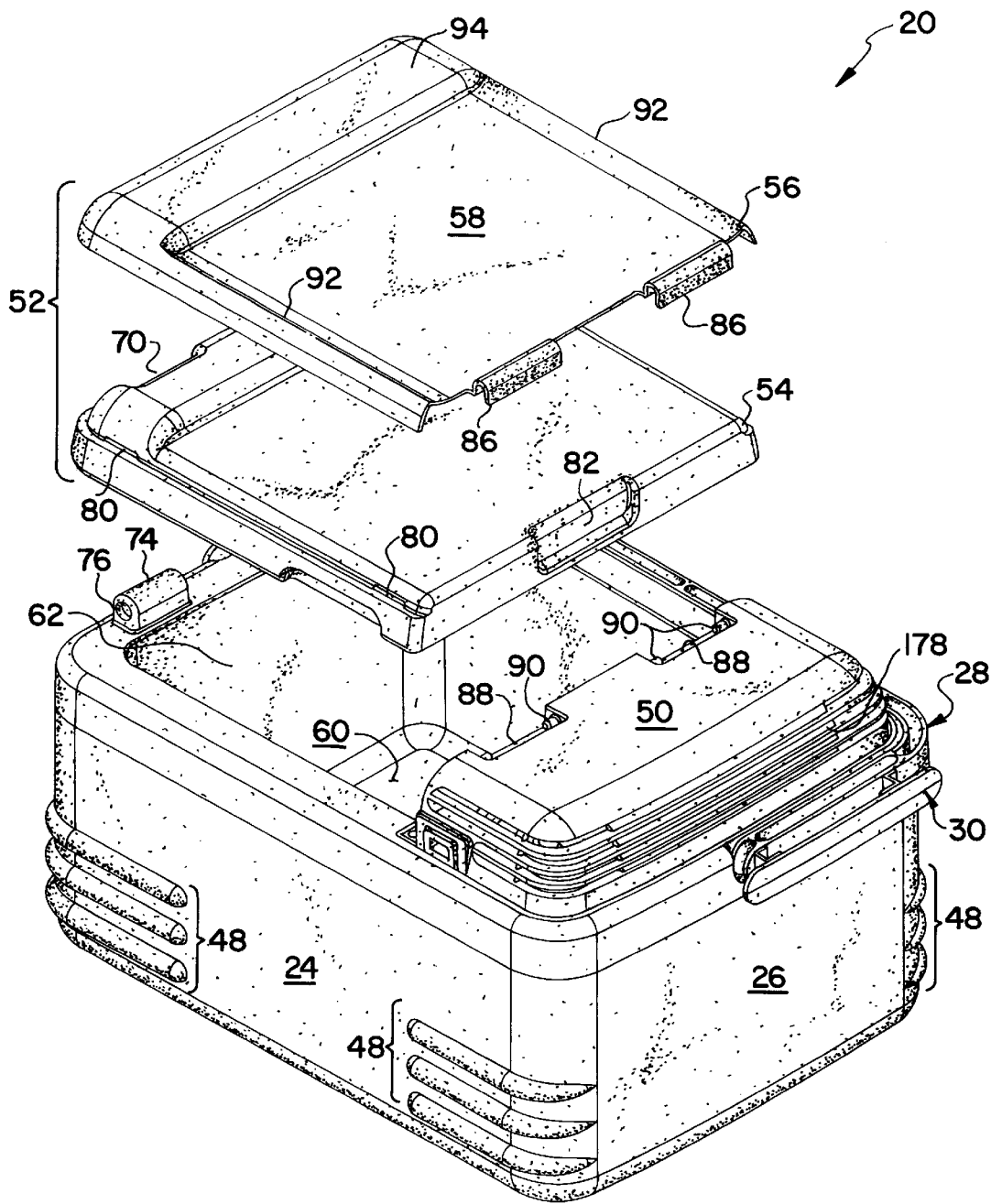
FIG. 4 is an exploded perspective view of the cooler/warmer of the present invention showing the lid structure and the tray structure detached from the main body of the unit.
Figure 5:
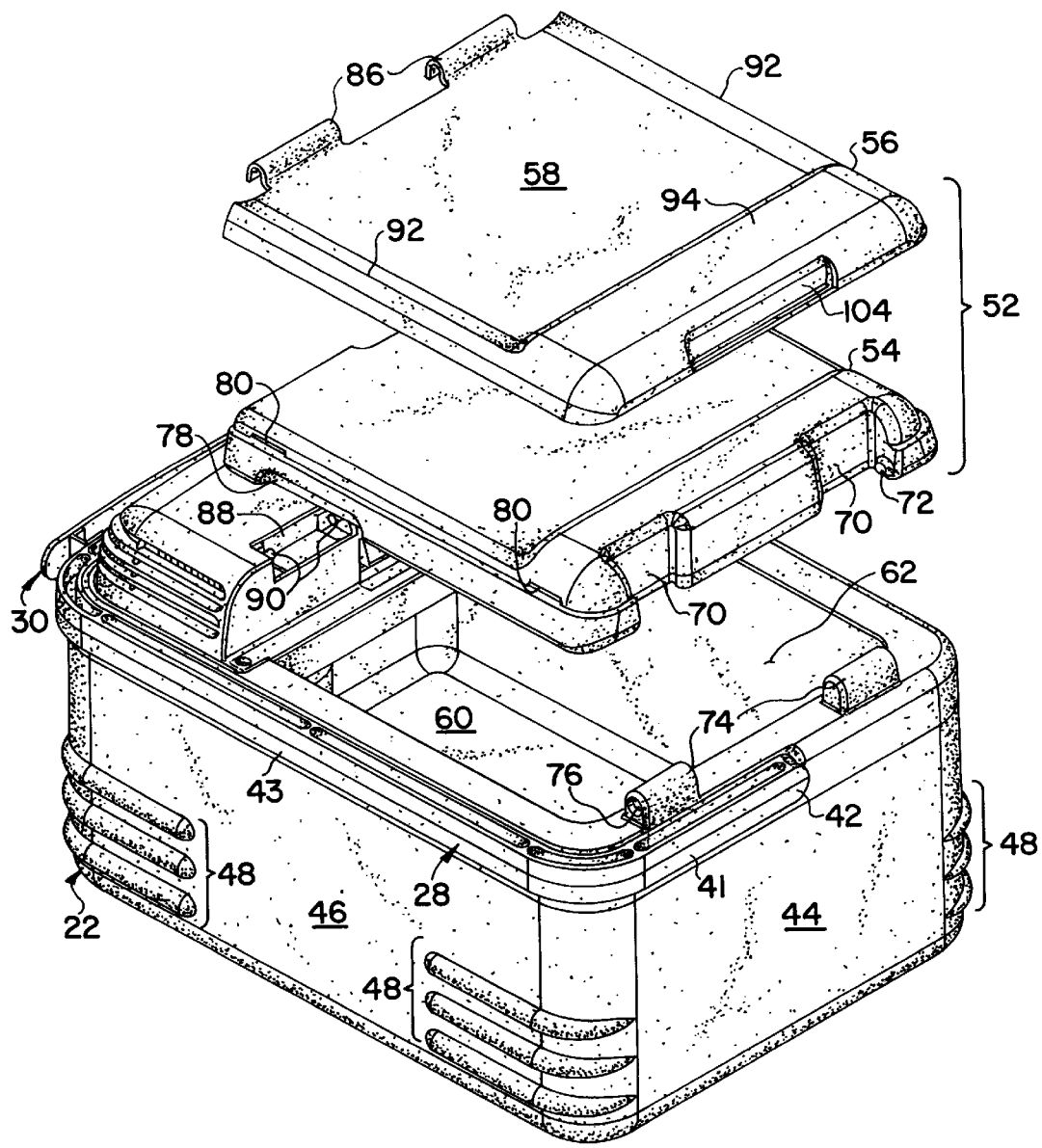
FIG. 5 is an exploded perspective view from an opposite direction as shown in FIG. 4.

The top of the cooler/warmer is comprised of a thermoelectric unit cover 50 which covers a thermoelectric unit, preferably a thermoelectric engine, to be described in more detail below. The top of the cooler/warmer further includes a door assembly 52 comprised of a lid 54 and tray 56 (see FIGS. 4 and 5). As shown in FIGS. 1, 3 and 7, the lid 54 and the tray 56 are detachably connected to each other so as to form the aforementioned integral door assembly 52. As shown, for example, in FIGS. 6 and 8, the underside of tray 56 is preferably provided with a plurality of tabs 106 proximate each of the four corners thereof. Tabs 106 on tray 56 engage receiving slots 80 formed proximate the four corners of the lid 54 as shown in FIGS. 4 and 5. Depending on the relative sizes of tabs 106 and slots 80 and also on manufacturing tolerances and wear of the respective parts, the engagement of each tab 106 with each slot 80 may vary between a frictional fit, a press fit, or a snap fit. Also, it will be appreciated that the tab and slot arrangement just described could be reversed. That is, tabs could be provided on the lid 54 which engage corresponding slots formed on the tray 56. Alternatively, tray 56 and lid 54 could be coupled to one another by other means, such as protuberances, or other protrusions, formed on either the tray or lid which engage, e.g., snap into, corresponding openings formed in the other.

Tray 56 and lid 54 are preferably formed of a molded plastic material, such as polypropylene, and it can be appreciated from FIGS. 1, 3 and 7 that the tray 56 and lid 54 are preferably formed with rounded edges so that when the two are coupled together to form the integral door assembly 52 they present a smooth, rounded, aesthetically pleasing structure. In addition, lid 54 is preferably insulated in a conventional manner.

Figure 6:
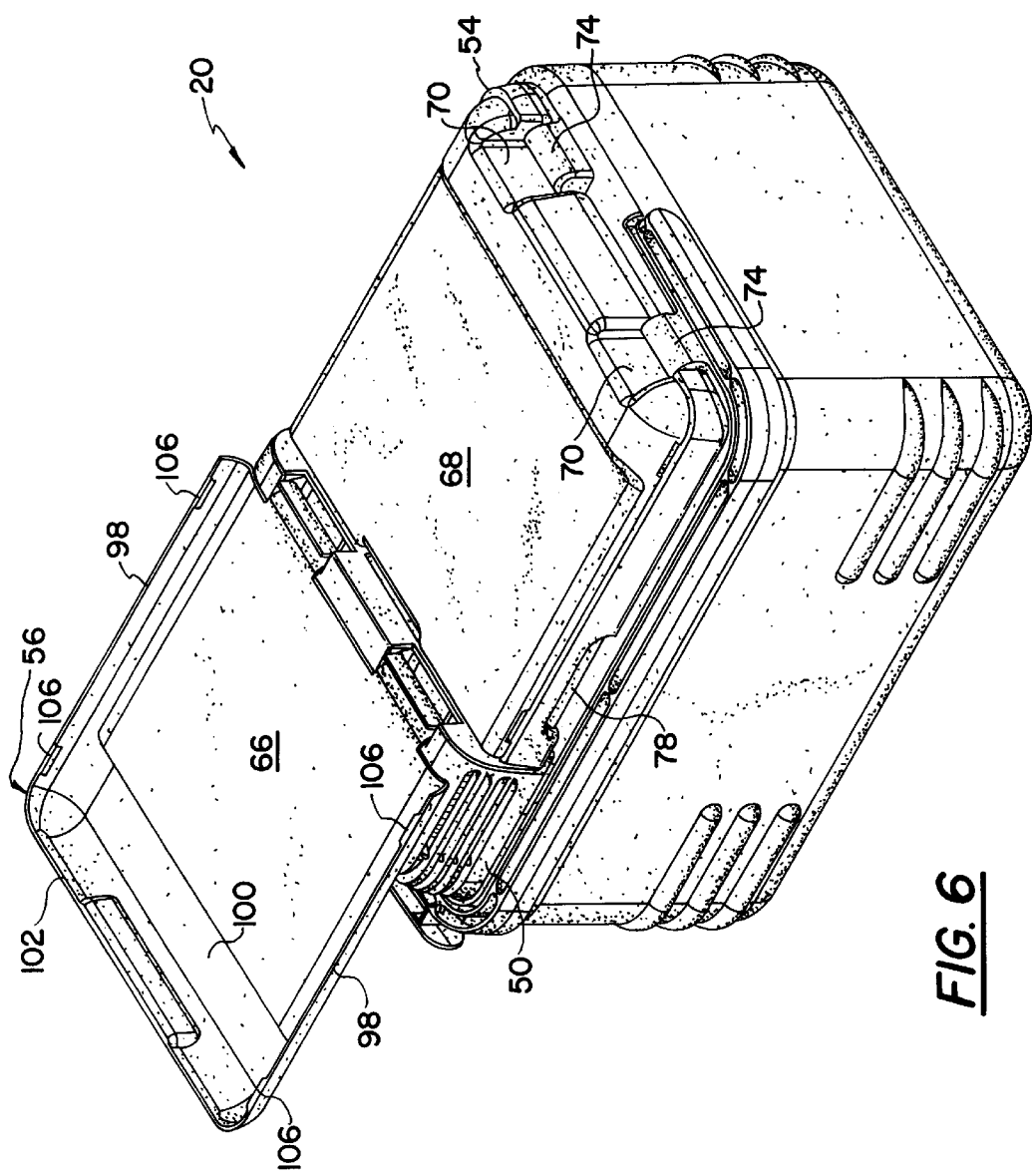
FIG. 6 is a perspective view of the cooler/warmer with the tray deployed in a table top position.
Figure 7:
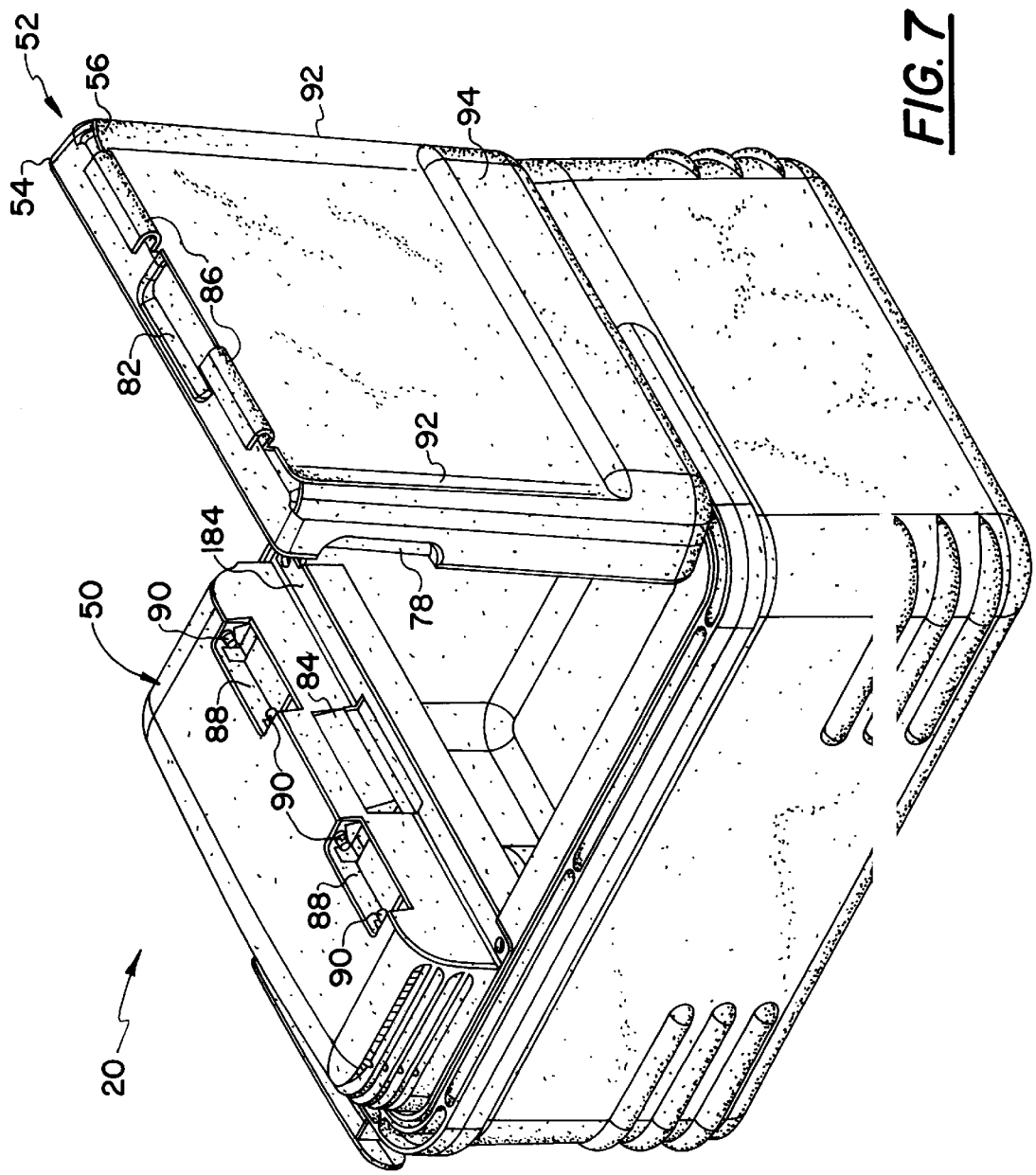
FIG. 7 is a perspective view of the cooler/warmer with the tray structure attached to the lid structure and with the lid pivoted into an opened position.
Figure 8:
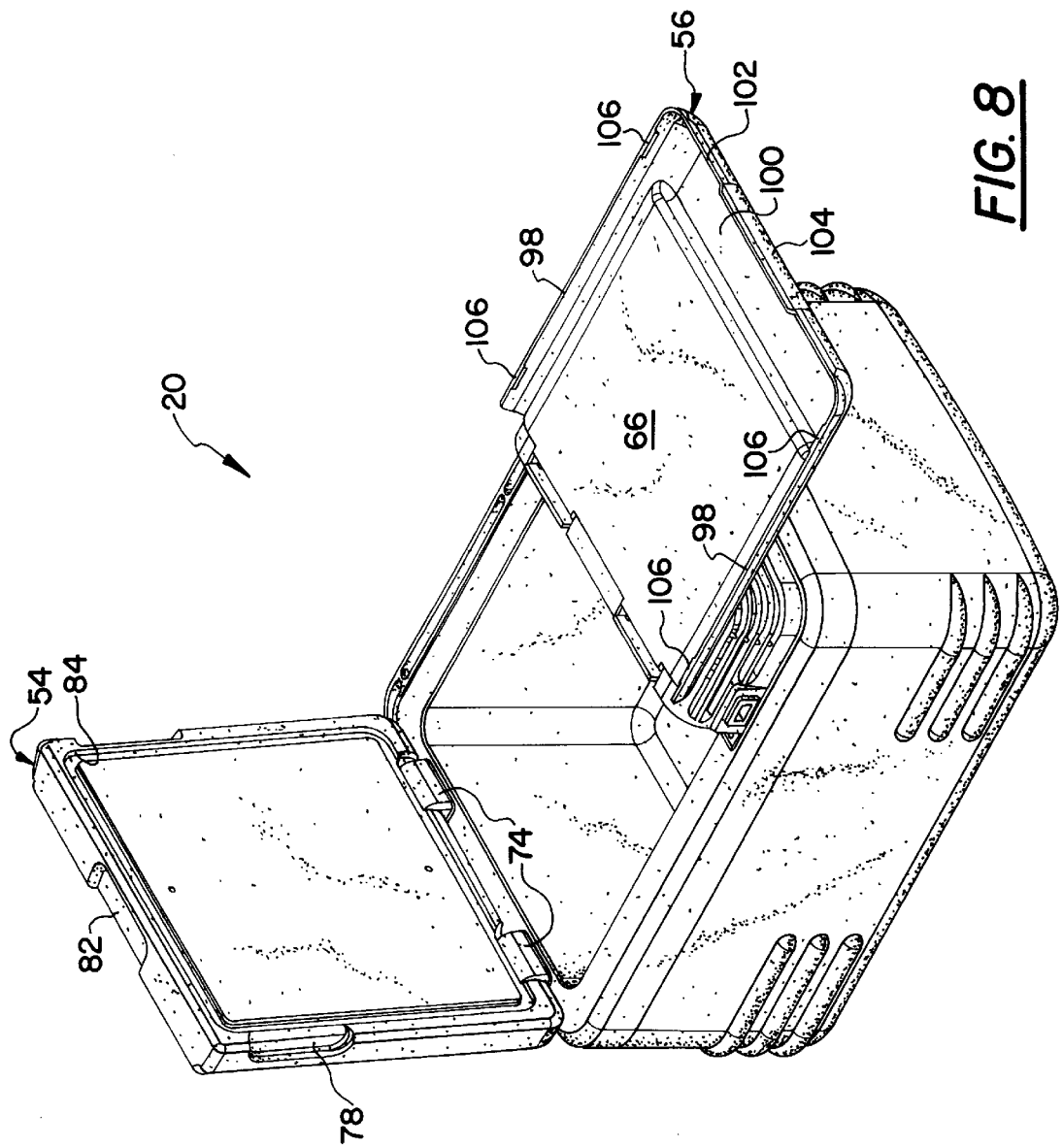
FIG. 8 is a perspective view of the cooler/warmer with the tray deployed in the table top position and the lid structure pivoted into an open position independently of the tray.

As shown in FIGS. 6 and 8, in accordance with the present invention, tray 56 is constructed and arranged so as to be pivotable with respect to the main body 22 independently from the lid 54. In the illustrated embodiment, this is preferably accomplished by providing two u-shaped hinges 86 (see FIGS. 4 and 7) which engage short lateral posts 90 that extend laterally from opposite ends of rectangular depressions 88 formed in an edge of the thermoelectric unit cover 50. The respective widths of the hinges 86 are preferably slightly smaller than the respective widths of the depressions 88. As can be appreciated, for example, from FIG. 6, with the hinges 86 seated on the posts 90, tray 56 is pivotable about the four colinear posts 90. It will be further appreciated that, alternatively, the same functionality could be achieved by providing, instead of truncated posts 90, a single rod extending across the entire respective width of each depression 88. Moreover, the functionality could also be achieved by interchanging the post and hinge structures; that is, by providing a suitable hinge structure on the thermoelectric unit cover 50 and corresponding post structure to be engaged by the hinge structure on the edge of the tray 56.

Hinges 86 may comprise clip structures that snap onto posts 90, if desired.

To pivot the tray 56 from the stowed position shown, for example, in FIGS. 1 and 3 to a deployed position shown, for example, in FIG. 6, tray 56 must be separated from lid 54. Accordingly, it is necessary to overcome the resistance of whatever structure is provided to hold tray 56 to lid 54, in the preferred case, tabs 106 on tray 56 which engage slots 80 on lid 54. To assist in gripping tray 56 when separating it from lid 54, a gripping indent 104 (see FIG. 5) is provided on an edge of the tray 56 opposite the hinges 86.

Figure 2:
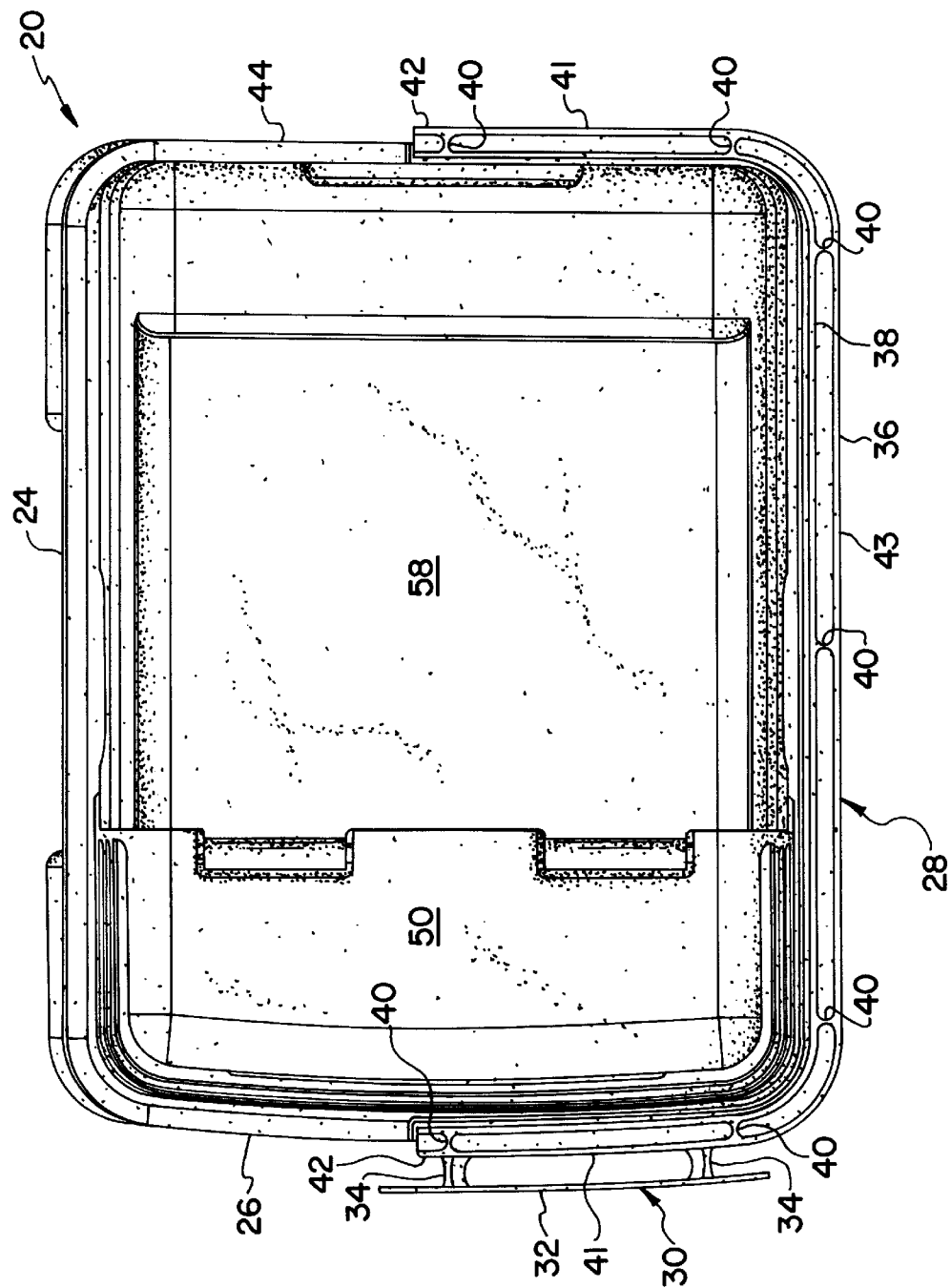
FIG. 2 is a top plan view of the heater/warmer of the present invention with the handle in a downward stowed position.

As shown in FIGS. 1 and 2, with tray 56 attached to lid 54 in the stowed position and with the door assembly 52 closed, tray 56 presents a supporting surface 58 which can be used as a table top to hold food or beverages, for example, on a picnic or in an automobile. The top surface of tray 56 is provided with two raised sides 92 and a raised end 94. Moreover, as can be appreciated from FIG. 3, tray 56, when in the stowed position, is preferably disposed somewhat below the top of thermoelectric unit cover 50. Accordingly, the edge of thermoelectric unit cover 50 and raised sides 92 and raised end 94 provide a raised periphery around first supporting surface 58 so as to prevent items setting thereupon from sliding off of the surface 58.

As shown in FIGS. 6 and 8, when tray 56 is pivoted into the deployed position, it presents a second supporting surface 66 which is also useful as a tray or a table top for setting food, beverages and other items thereupon, for example, in an automobile or on a picnic. As can be appreciated from FIGS. 6 and 8, when tray 56 is in the deployed position, it rests upon and is supported by thermoelectric unit cover 50.

With tray 56 deployed as a table top so as to present second supporting surface 66, the side edges 98 and the end edge 102 of tray 56 extend above second supporting surface 66 so as to present raised peripheral edges to prevent items set upon second supporting surface 66 from sliding off of the surface. In addition, raised portion 94 on the top of tray 56 presents a trough 100 on the bottom side of tray 56, which is useful for holding small items.

It can be appreciated that tray 56 can also be completely removed from the container 20 to be used as an independent tray by lifting it straight off lid 54 (see FIGS. 4 and 5).

While tray 56 is preferably a relatively thin, uninsulated member, it can be appreciated from FIGS. 4, 5 and 8 that lid 54 is a thicker member, preferably insulated in a conventional manner. Lid 54 is attached to the top of a sidewall of the main body 22 at one end thereof by a hinge assembly that includes engagement structure on the lid 54 which engages corresponding engagement structure on the main body. In the illustrated embodiment, the hinge assembly includes two cutout areas 70 formed in one end of the lid 54 with short circular protrusions, or posts, 72 extending from an outside edge of the cutout areas 70. Although only one post 72 is shown in FIG. 5, it will be appreciated that a second post is provided on the opposite cutout area 70 which is colinear with the post 72 shown in FIG. 5.

Two raised semi-cylindrical members 74, preferably having a width only slightly smaller than that of the cutout areas 70, are provided on the top edge of end wall 44. An outwardly facing circular opening 76 is formed on the outside end of each raised member 74. Openings 76 receive the posts 72 extending into the cutout areas 70, and it can be appreciated that lid 54 is pivotably coupled with the main body 22 by fitting posts 72 into openings 76. Accordingly, as shown in FIGS. 7 and 8, lid 54 is pivotable with respect to the main body 22 of the container 20 about the aligned posts 72.

The engagement of posts 72 with openings 76 is preferably a factory installed press fit not intended to be detachable by the final consumer. Alternatively, however, the engagement of posts 72 with openings 76 could also be a detatchable frictional fit or a snap fit. In addition, it will be appreciated that, in accordance with the broadest aspects of the present invention, a hinge coupling could be achieved by other means, such as providing pivoting posts and corresponding receiving openings on both sides of the cutout portions 70 and raised members 74, respectively, or by interchanging the posts and receiving openings, that is by providing receiving openings on one or both sides of each cutout portion 70 and corresponding posts on one or both sides of each raised member 74.

As shown in FIG. 7, lid 54 is coupled to the remainder of main body 22 at the end opposite the hinge assembly by means of a detent indentation 82 formed in an edge of the lid 54, which engages a detent protrusion 84 formed in an edge of the thermoelectric unit cover 50. It will be appreciated that the positions of the indentation 82 and protrusion 84 could be reversed. Accordingly, lid 54 is secured to the main body 22 of the container 20 by both the hinge assembly and the detent structures 82 and 84.

As shown in FIG. 6, with lid 54 closed and tray 56 removed or deployed as an independent table top, a supporting surface 68 is presented on top of lid 54.

Lid gripping indentations 78 are preferably formed on either side of the lid 54 towards an end of the lid opposite the hinge assembly to facilitate gripping of the lid 54 for opening the lid and overcoming the frictional engagement of the detent protrusion 84 in the detent indentation 82. In addition, it can be appreciated from FIG. 7 that if clip hinges are employed to couple tray 56 with main body 22, then when the tray 56 is stowed onto the lid 54, the door assembly 52 is held closed by both the detent structures 82 and 84 and the clip hinges engaged with the hinge posts 90.

As can be appreciated from FIGS. 6–8, the lid 54 and tray 56 can be opened as a single integral door assembly 52, or the lid 54 can be opened independently of the tray 56 when the tray 56 is deployed as a table top.

As shown in FIG. 8, the bottom side of lid 54 is preferably provided with a peripheral groove 84 for containing a suitable gasket therein. Such a gasket provides an improved seal between lid 54 and the top edges of the sidewalls of the main body 22 to effectively seal off compartment 62. Also, thermoelectric unit cover 50 includes shelf portion 184 which forms part of the seat for lid 54.

The above-described lid and tray features are shown in the figures as used with a device having positive cooling and warming capability, that is, a device having a thermoelectric engine. It can be appreciated, however, that in accordance with the broadest aspects of the present invention, the advantages of the above described lid and tray can be achieved with a conventional insulated cooler, or other container, having no thermoelectric unit or other electromechanical means of cooling.

In conventional coolers, the overall height of the unit is typically the same as or greater than the overall width and the same as or greater than the overall length. Accordingly, a conventional unit will have a height-to-width aspect ratio and a height-to-length aspect ratio of equal to or greater than 1. This presents a number of disadvantages. First, if the unit is too high, and is used on the seat of a motor vehicle, the unit itself can present an obstacle to the occupants of the vehicle. In addition, a unit with an aspect ratio of greater than or equal to 1 presents a relatively high center of gravity, especially in units provided with a thermoelectric engine, which is typically provided near the top of the cooler. Accordingly, such a unit can be unstable, especially when used on an inherently unstable surface, such as a vehicle seat in a moving vehicle.

As illustrated in FIGS. 1–3, the height of the container 20 of the present invention, when used in a top opening ice chest orientation, is less than both the width of the unit and the length of the unit. Accordingly, the container 20 has a height-to-width aspect ratio and a height-to-length aspect ratio of less than 1. Thus, the unit is less likely to present an obstacle to vehicle occupants when the unit is used on a vehicle seat, and the unit is more stable.

Although not intended to be limiting, it is presently contemplated that a container built according to the present invention would have an overall height of approximately 11.25", a length of 19", and a width of 13.5". On the other hand, a cooler/warmer having a thermoelectric unit that is available on the market today has a height of about 16½", a width of 9½", and a length of 12⅝".

As shown in FIG. 1, the cooler/warmer 20 of the present invention preferably includes a u-shaped bail type handle 28 extending across the length of the unit. The handle 28 includes two leg portions 41 connected by a transverse portion 43, and the ends 42 of the legs 41 of the u-shaped handle are pivotably coupled to the main body 22 at the centers of opposing end walls 26 and 44.

The preferred structure of the handle 28 includes two coextending portions 36 and 38 extending substantially parallel to one another for the entire extent of the handle 28. Coextensive portions 36 and 38 are connected by a plurality of cross ribs 40 extending therebetween. Such a construction presents a strong yet lightweight handle structure.

Cooler/warmer units provided with a thermoelectric warming and cooling ability require a power cord so that the thermoelectric engine can be connected to a power source, such as a wall outlet or a cigarette lighter receptacle in an automobile. Such power cords, especially those used in automobiles where it may be desirable to use the cooler/warmer unit in the back seat of a car or in the back of a van, can reach substantial lengths of 8 feet or more. Accordingly, it is desirable to have the ability to conveniently stow the excess cord when not in use so as to avoid entanglement. Therefore, in accordance with one aspect of the present invention, a cord holder 30 is provided for wrapping excess cord thereon. Cord holder 30 is preferably attached to the leg 41 of the handle 28 and includes a longitudinal portion 32 spaced from and connected to the handle 28 by means of two transverse rib members 34. Cord holder 30 is preferably integrally molded with the handle 28.

Figure 9:
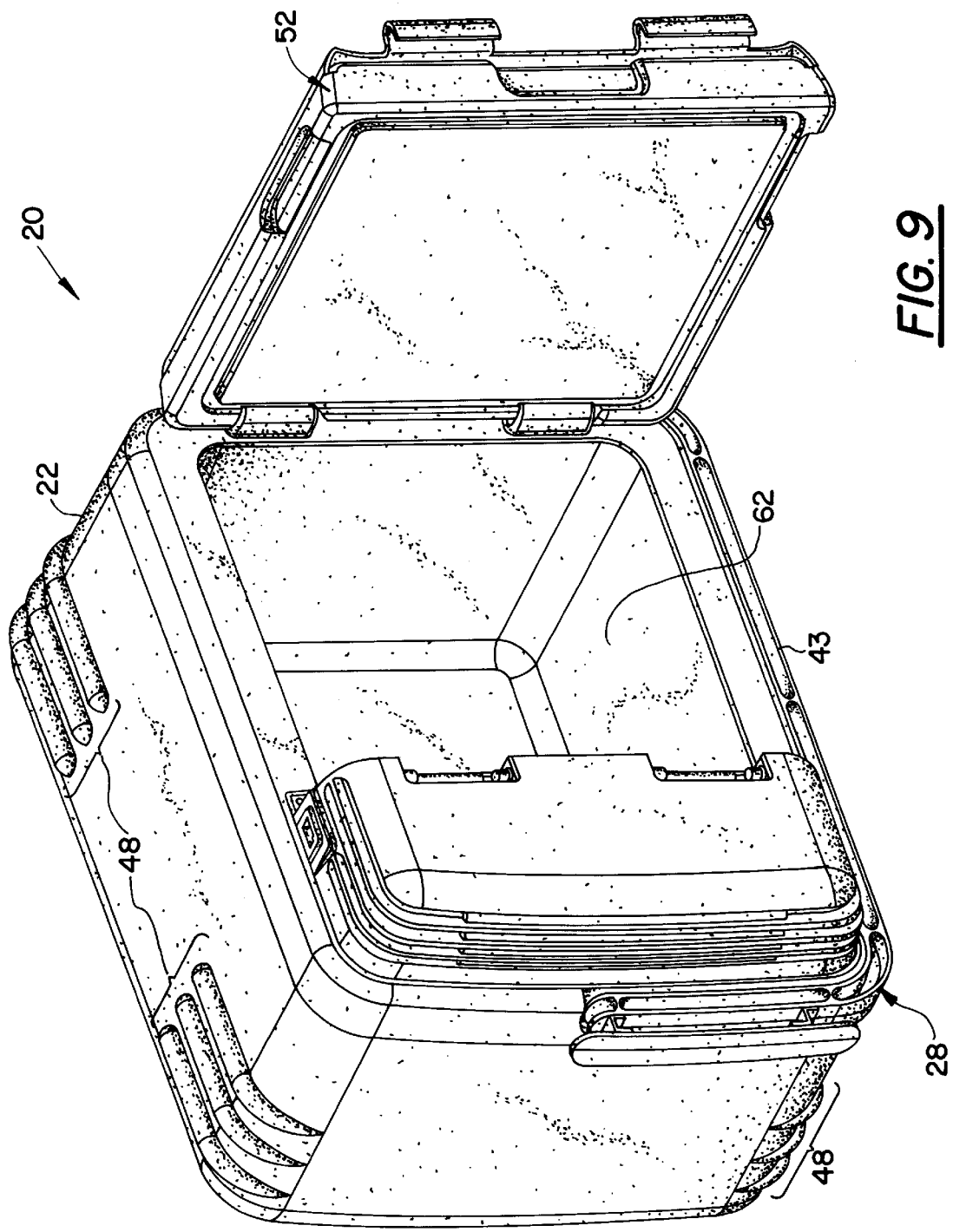
FIG. 9 is a perspective view of the cooler/warmer situated in a front-opening orientation with the tray structure attached to the lid structure and with the lid pivoted into an opened position.

In addition to using a portable cooler/warmer unit as a top opening chest, it is often desirable to use the unit as a front opening office or dorm room sized cooler or warmer. The present invention accommodates this flexibility by providing clearance structure on at least one side of the main body 22 so that the unit may be set upon that side and the door assembly can be easily swung open without scraping the surface upon which the unit is supported. As shown in FIG. 9 and as can be appreciated from FIGS. 1, 2 and 4, in accordance with the present invention, such clearance structure is provided by the ribs 48 formed on the back side 46 of the main body 22 and the transverse portion 43 of handle 28 which extends outwardly from the side of the main body 22 when it is in its lower stowed position. As shown in FIG. 1, a recess 182 is preferably provided along the entire length of the back side 46 and along half the length of the ends 26 and 44. Recess 182 provides a convenient unobtrusive location in which the handle may be stowed. As can be appreciated from FIGS. 2 and 9, the depth of the recess 182 and the thickness of handle 28 are preferably such that, with handle 28 in the stowed position, a portion of handle 28 extends outwardly from the side 46 so as to provide clearance structure. Accordingly, it can be appreciated that with the unit 20 tipped onto its back side 46, the unit will be supported in a stable position upon the transverse portion 43 of handle 28 and upon ribs 48.

As shown in the various figures, in the presently preferred embodiment of the invention, ribs 48 are provided toward the lower portions of front and back walls 24 and 46. In the broadest aspects of the present invention, however, it is equally contemplated that such ribs could be provided toward the lower and upper portions of the front and back walls 24 and 46 so that the previously described clearance structure is provided entirely by such sidewall ribs.

Figure 10:
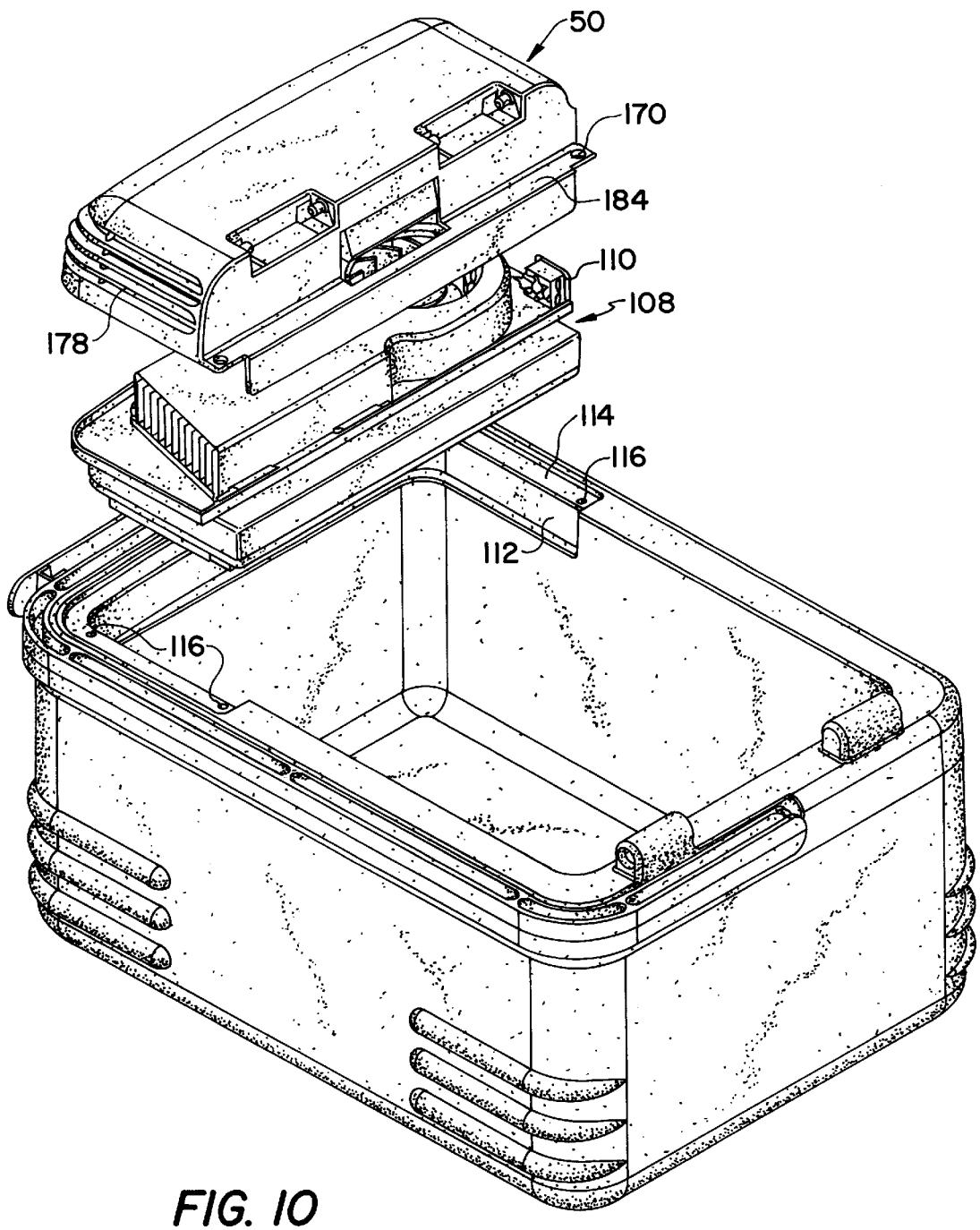
FIG. 10 is an exploded perspective view of the cooler/warmer without either the tray or lid structures and showing assembly of the unit with a thermoelectric engine and a thermoelectric engine cover.
Figure 11:
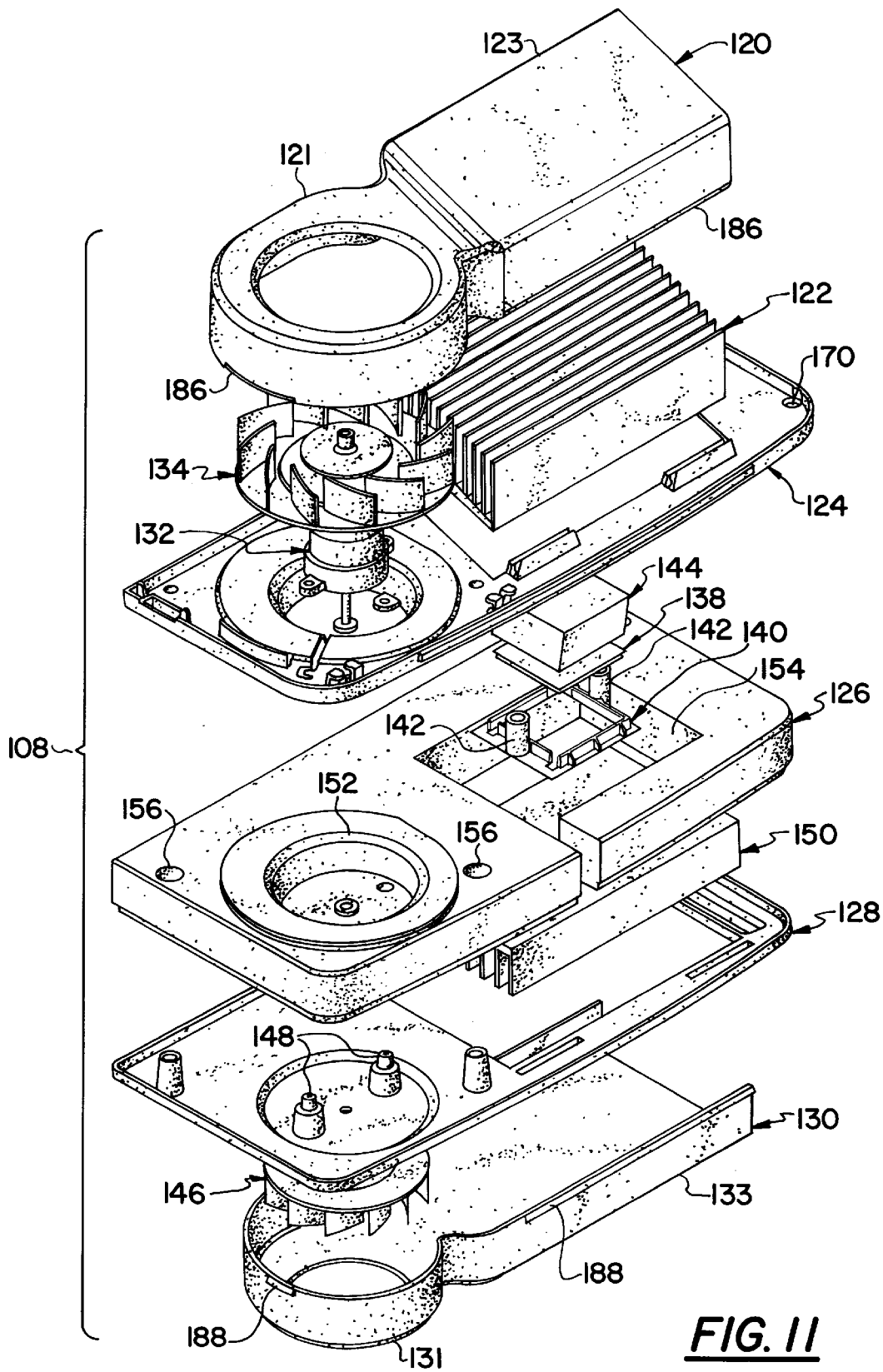
FIG. 11 is an exploded perspective view of a thermoelectric engine.

A further aspect of the present invention is shown in FIGS. 10 and 11. According to the present invention, a thermoelectric unit, or thermoelectric engine 108, is assembled as an integral modular "cassette" which can be easily installed or removed from the remainder of the cooler/warmer unit 20. Thermoelectric unit 108 is preferably attached to the cooler/warmer unit by means of screws or other suitable fasteners. In a preferred embodiment of the present invention, a plurality of attachment holes 106 is provided in the top of the side walls for attachment of the thermoelectric unit 108 thereto. Thermoelectric unit 108 also includes a plurality of fastening holes 170 (see FIGS. 10, 12A, and 12B). In addition, recessed portions 112 and 116 are provided across the tops and the upper edges of the inner sides of the front, back, and end sidewalls. Recessed areas 112 and 114 further accommodate installation of the thermoelectric unit 108 into the cooler/warmer main body 22.

The thermoelectric unit 108 may include a plug 110 to which a power cord (not shown) may be attached. On the other hand, the power cord could be hard wired into the thermoelectric engine, or the thermoelectric engine may have a portable power source such as a battery pack.

The thermoelectric unit cover 50 is placed over the thermoelectric unit 108 when the thermoelectric unit 108 is installed. Thermoelectric unit cover 50 is also preferably held in place by screws or other suitable fasteners. The thermoelectric unit 108 includes one or more fans as will be described in more detail below. Accordingly, thermoelectric unit 50 includes air vents 178 through which air may be moved into or out of the thermoelectric unit cover.

Assembly of the thermoelectric engine cassette 108 will be described in conjunction with FIG. 11.

For purposes of description, the thermoelectric engine cassette 108 is divided into an inner half for that portion considered to be disposed within the cooling/warming compartment 62 of the main body 22 and an outer half for that portion of the cassette considered to be disposed outside of the cooling/warming compartment 62. An insulating panel 126 divides the inner half from the outer half. Insulating panel 126 is preferably insulated and includes a number of openings and other formations for accommodating various components of the thermoelectric unit cassette.

Disposed within a rectangular opening 154 of the insulating panel 126 is a thermoelectric module 138. The construction and operation of thermoelectric modules are well known and thus will not be described in any detail herein. Thermoelectric module 138 is disposed in a module retaining device 140, which preferably comprises a square or rectangular frame of approximately the same size as the module 138. A spacer means 144, preferably composed of aluminum, is disposed in thermal contact with the thermoelectric module 138.

Disposed on the outer half of the insulating panel 126 is an outer plate 124 and an outer heat sink 122. Also disposed on the outer half is a fan motor 132 and a centrifugal outer fan 134 operatively coupled with fan motor 132. A fan motor accommodating cup 164 is provided in the outer plate 124, and the cup 164 is in turn accommodated by a cup 152 disposed in insulating panel 126. An outer fan cover 120 covers both the outer fan 134 and the outer heat sink 122 so as to create a scroll housing 121 around the fan and an air plenum 123 around the heat sink.

Details of the construction of the outer plate 124 are shown in FIGS. 12A and 12B. As shown in FIGS. 12A and 12B, outer plate 124 includes an opening 158 to accommodate the outer heat sink 122, and the motor accommodating cup, or receptacle, 164 extends below the upwardly facing surface of outer plate 124. A slot 161 may be provided on one end of the outer plate for inserting the plug therein. If the power cord is hard wired to the thermoelectric engine, however, there will, of course, be no plug. Also wire clip structures 162 are preferably provided for securing wires within the thermoelectric cassette 108. Additional clip structures 160 are provided for attaching the outer fan cover 120 thereto. As shown in FIG. 11, outer fan cover 120 includes a plurality of flanges 186 which can be fitted into and engaged with the clips 160 so as to secure the outer fan cover to the outer plate 124. Alternatively, fan cover 120 could be attached to outer plate 124 by means of suitable mechanical fasteners, such as screws.

Disposed on the inner half of the insulating panel 126 is an inner plate 128, an inner heat sink 150, an inner centrifugal fan 146 operatively coupled with fan motor 132, and an inner fan cover 130 forming a scroll housing 131 over the inner fan 146 and an air plenum 133 around inner heat sink 150. Details of the construction of the inner plate 128 are shown in FIGS. 12C and 12D. Inner plate 128 includes an opening 172 to accommodate inner heat sink 150 and a circular embossment 200 for accommodating the end of the cup 152 formed in insulating panel 126 (see FIG. 11). Inner plate 128 further includes a plurality of clips 176 into which flanges 188 of inner fan cover 130 may be fitted to secure the inner fan cover 130 to the inner plate 128. Fan cover 130 could be attached to inner plate 128 by means of mechanical fasteners, such as screws. Two raised bosses 148 are provided for receiving screws or other fasteners for securing the fan motor 132 in place.

Inner plate 128 also preferably includes an air deflector/diffuser 178. When the cassette structure 108 is installed into the cooler/warmer unit, deflector/diffuser 178 extends downwardly into the compartment 62 of the main body 22. Therefore, air generated by inner fan 146 and passing over inner heat sink 150 will be directed by the deflector/diffuser 178 into the main body compartment 62.

The entire assembly is constructed in a sandwich configuration with the insulating panel 126 sandwiched between the inner plate 128 and the outer plate 124. Preferably, a plurality of raised bosses 174 are provided on the upper side of the inner plate 128. When the cassette is assembled, bosses 174 extend into holes 156 formed in insulating panel 126. Outer plate 124 preferably has a plurality of holes 168. The sandwiched structure is held together by screws or other suitable fasteners inserted through holes 168 into raised bosses 174. Alternatively, the sandwiched structure could be held together by other means, such as, for example, protuberances, or other protrusions, extending from one plate which engage openings formed in the other plate.

Outer heat sink 122, inner heat sink 150, thermoelectric module 138, module retaining device 140, and spacer means 144 are preferably held together and in place by two suitable fasteners, such as bolt and nut combinations, extending from one heat sink into the other. As alternative to the embodiment shown in FIG. 11, spacer means 144 could be an integral part of a heat sink, formed, for example, by machining, casting, extruding, or molding. The fasteners pass through tubular members 142 fixed onto opposite sides of the module retaining device 140. Accordingly, it can be appreciated that the module retaining device 140, module 138, spacer means 144, and the insulating panel 126 are securely sandwiched between the outer heat sink 122 and the inner heat sink 150, the spacer means 144 completing a thermal connection between the module 138 and the outer heat sink 122 in a known manner.

Figure 13:
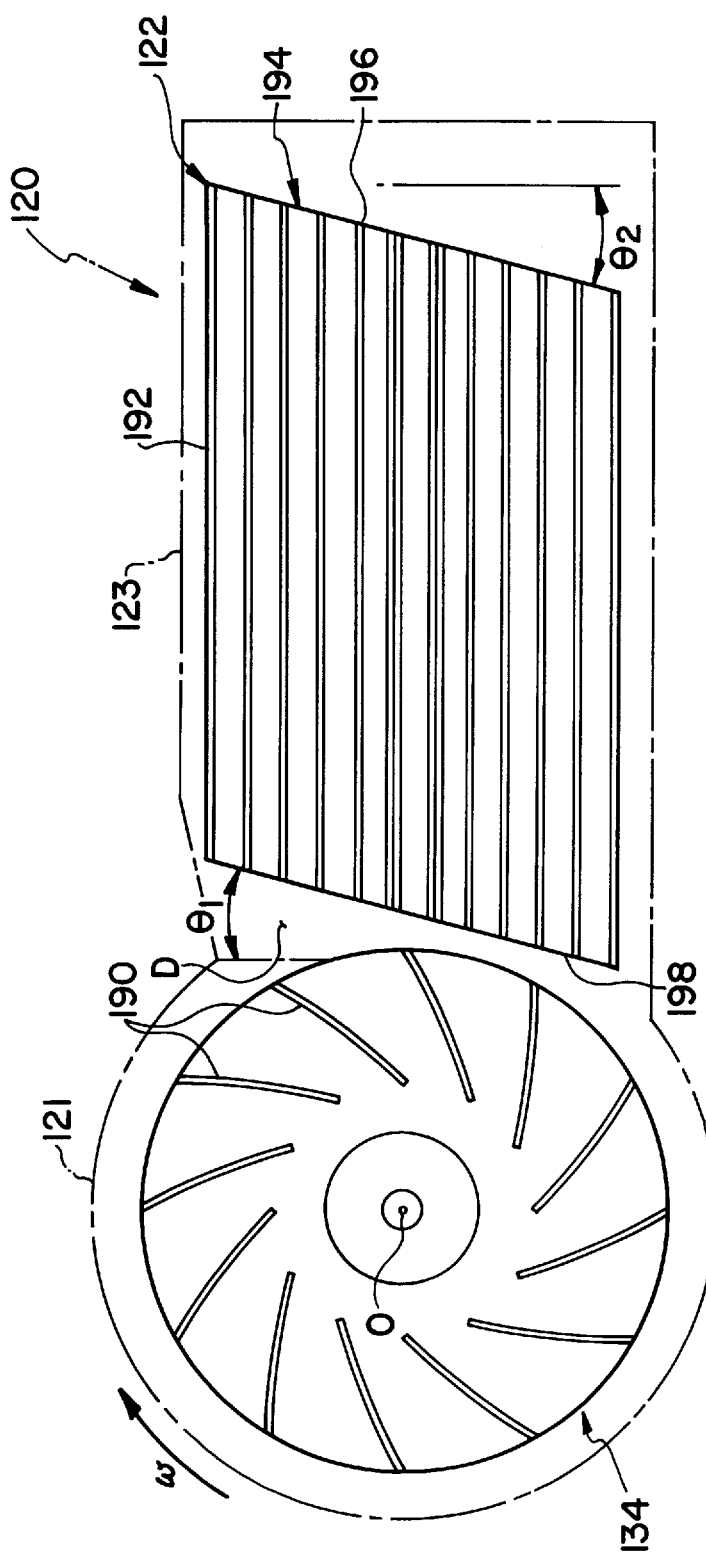
FIG. 13 is a plan view of a finned heat sink formed as an oblique parallelogram according to the present invention.

It is a further aspect of the present invention to provide an improvement in heat sink construction. As shown in FIG. 13, the outer heat sink 122 of the present invention is in most respects of conventional design. It includes a flat base portion 194 with a plurality of mutually parallel longitudinally extending fins 192 which extend perpendicularly from the flat base 194. Unlike conventional finned heat sinks, however, heat sink 122 is preferably not rectangular.

As shown in FIG. 13 outer heat sink 122 is disposed in close proximity to outer centrifugal fan 134. When a centrifugal fan is placed in close proximity to a conventional, rectangular heat sink, as is often necessary within the close confines of a portable cooler/warmer unit, or also, for example, within a personal computer, the velocity distribution of the air generated by the fan and directed by the housing over the heat sink is not uniform across the width of the heat sink because the moving air contacts the fins of the heat sink at different angles. Nonuniform air flow over the heat sink causes inefficient heat transfer between the moving air and the heat sink because heat transfer at fins where air is moving at a lower velocity is generally less than at fins where air is moving at a greater velocity. This is not a problem where the fan is spaced from the heat sink by a sufficient distance so that the air flow that reaches the heat sink is essentially uniform.

The present inventors have found that by appropriately shaping the end of the heat sink nearest the fan, that is, the intake end, the uniformity of the air velocity distribution across the width of the heat sink is improved. The heat sink 122 of FIG. 13 includes an intake end 198 in close proximity to fan 134 and a discharge end 196 further removed from fan 134 than intake end 198. Fan 134 includes a plurality of backwardly curved blades 190 swept such that clockwise rotation of fan 134 in direction ω generates air flow tangentially to and radially outward from fan 134. The scroll portion 121 (shown in phantom in FIG. 13) of the cover 120 (also shown in phantom in FIG. 13) captures the air flow and discharges it in a desired direction. In the case of a centrifugal fan rotating clockwise, most of the discharge occurs above the axis O of the fan at location D when looking down on the fan and fan cover. Of course, for a counterclockwise rotating fan, most of the air would be discharged below the axis of the fan for the scroll housing configuration shown in FIG. 13.

Because most of the discharge occurs at D, the fins located above the axis O of the fan would capture most of the discharged air flow if the intake end were straight and if the center of the heat sink were aligned with the center O of the fan. To even the distribution of the air across the heat sink, or at least to achieve maximum air flow through the center of the heat sink, assuming the heat source, e.g., the thermoelectric module, is closest to the center of the heat sink, the center of the heat sink can be offset with respect to the center O of the fan, so that the center of the heat sink is aligned with the discharge area D. This, however, results in an inefficient use of space.

Alternatively, the present inventors have discovered that the airflow characteristics can be improved by shaping the intake end 198, or by turning the orientation of the heat sink with respect to the fan, so that the fins directly adjacent the discharge area D are further removed from the fan than the fins not located proximate the discharge area. Accordingly, compared to a heat sink with a straight, i.e., perpendicular, intake end, a smaller proportion of the discharged air will be captured by the fins located adjacent the discharge area D and fins further removed from the discharge area D will capture a larger proportion of the discharged air so that the overall air flow distribution across the heat sink will be more equalized. Preferably, the proper intake end shaping is accomplished by forming the heat sink as an oblique parallelogram as shown in FIG. 13.

Intake end 198 is shifted from a line perpendicular to the fins 192 by an angle $\Theta_1$. The magnitude of $\Theta_1$ is determined by the configuration of the scroll portion 121 of the housing 120. It is presently preferred that $\Theta_1$ be 15 degrees. The discharge end 196 need not be specially shaped and may be perpendicular to the fins 192, although, for ease of manufacturing, it is preferred that discharge end 196 be shifted from perpendicular by an angle $\Theta_2$, which is preferably equal to $\Theta_1$. Also, as shown in FIG. 13, with fan 134 rotating in a clockwise direction ω such that air flow generated by fan 134 is directed radially away from the fan, end 198 is skewed from normal in a clockwise direction by angle $\Theta_1$ so that the fins on the upper half of the heat sink are further removed from the fan than those on the lower half. On the other hand, if the sweep of the blades of the fan were opposite so that outward radial flow would be generated by counterclockwise rotation of the fan, end 198 would be skewed from normal in a counterclockwise direction by angle $\Theta_1$.

Orienting the discharge end so as to achieve a more equal air flow distribution across the width of the heat sink may also be accomplished by skewing a rectangular heat sink so that the distance between the intake end of the heat sink and the fan decreases progressing away from the discharge area of the housing. Alternatively, the intake end of the fan may be curved to achieve the same effect.

Figure 14A:
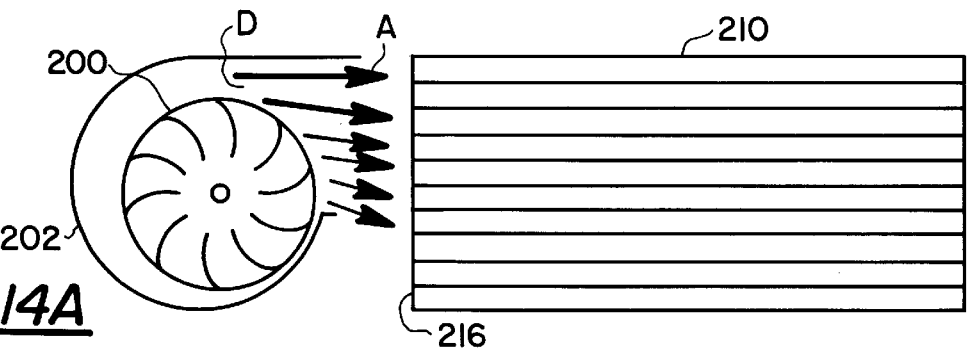
FIGS. 14A–14D illustrate air flow from a centrifugal fan and scroll housing into four different heat sink configurations.

The above-described phenomena are illustrated in FIGS. 14A–14D. In FIG. 14A is shown a rectangular heat sink 210 with a straight perpendicular intake end 216. The fan 200 is disposed within a scroll, or volute, housing 202 having a straight discharge portion D. The airflow is represented schematically by arrows A, the larger and bolder the arrow the greater the relative volume of airflow. As can be appreciated from FIG. 14A, the greatest volume of discharged air is captured by the top portion of heat sink 210, while the bottom portion of the heat sink captures little or no discharged air.

Figure 14B:
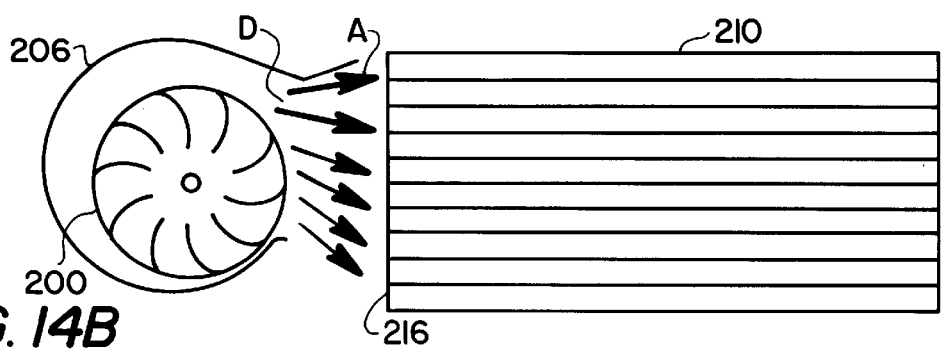

In FIG. 14B is shown a rectangular heat sink 210 with a straight perpendicular intake end 216. The fan 200 is disposed within a scroll, or volute, housing 206 having a somewhat more restricted, inwardly angled discharge portion D. As can be appreciated from FIG. 14B, the inward angling of the discharge of the housing 206 does direct some of the discharged air away from the top fins so that, in general, the remaining fins capture a greater volume of the discharged air than with the housing configuration of FIG. 14A.

Figure 14C:
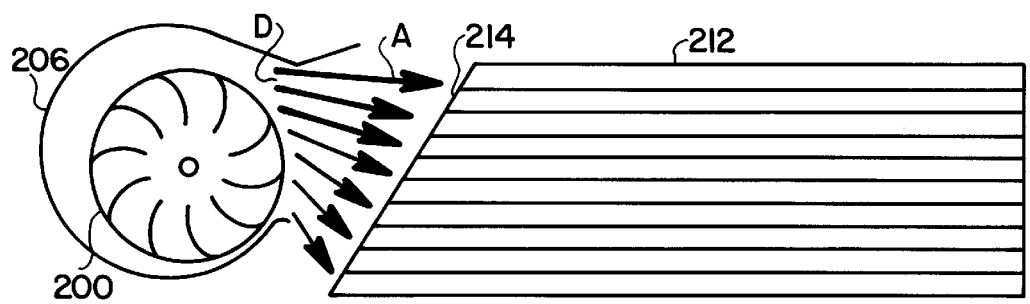

In FIG. 14C is shown a heat sink 212 with a straight, but angled intake end 214. The fan 200 is again disposed within a scroll housing 206 having a somewhat more restricted, inwardly angled discharge portion D. As can be appreciated from FIG. 14C, the angling of intake end 214 results in an even greater volume of discharged air being captured by the lower fins of heat sink 212. This is because the greater distance between the discharge D and the upper fins permits the discharged air in the area of the upper fins to expand more and thus become more evenly distributed.

Figure 14D:
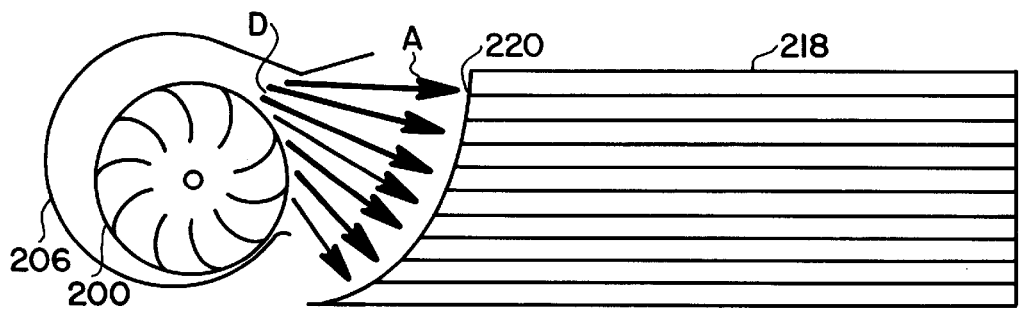

Finally, in FIG. 14D is shown a heat sink 218 with a curved intake end 220. The fan 200 is again disposed within a scroll housing 206 having a somewhat more restricted, inwardly angled discharge portion D. As can be appreciated from FIG. 14D, the curve of intake end 214 results in an even greater volume of discharged air being captured by the lower fins of heat sink 218. This is because, as with the angled intake end 214 shown in FIG. 14C, the greater distance between the discharge D and the upper fins permits the discharged air in the area of the upper fins to expand more and thus become more evenly distributed.

It will be realized that the foregoing preferred specific embodiments of the present invention have been shown and described for the purposes of illustrating the functional and instructional principles of this invention and are subject to change without departure from such principles. Therefore, this invention includes all modifications encompassed within the spirit and scope of the following claims.

What is claimed is:

1. A container comprising:
   a main body having a base wall and four sidewalls extending from said base wall so as to define a product receiving compartment;
   a lid member constructed and arranged to be movable with respect to said main body between (1) a closed position closing off said product receiving compartment and (2) an opened position permitting access to said product receiving compartment; and a tray member constructed and arranged to be movable with respect to said main body and said lid member between (1) a stowed position whereby said tray member is engaged with and movable with said lid member between said closed position and said opened position and (2) a deployed position wherein said tray member is engaged with said main body to present a generally upwardly facing supporting surface and said lid member is movable between said opened position and said closed position independently of said tray member.

2. A container comprising:

a main body having a base wall and four sidewalls extending from said base wall and defining a product receiving compartment;

a lid member constructed and arranged to be movable between (1) a closed position closing off said product receiving compartment and (2) an opened position permitting access to said product receiving compartment, said lid member including first engagement structure; and a tray member comprising:

a first supporting surface, having a raised portion extending proximate a peripheral edge thereof to inhibit products supported on said first supporting surface from sliding off said peripheral edge thereof;

a second supporting surface opposite said first supporting surface, said second supporting surface having a raised portion extending proximate a peripheral edge thereof to inhibit products supported on said second supporting surface from sliding off said peripheral edge thereof; and second engagement structure complimentary to said first engagement structure of said lid member, wherein engagement of said first engagement structure with said second engagement structure detachably secures said tray member to said lid member so as to present a one of said first and second supporting surfaces.

3. The container of claim 2 wherein said tray member further includes first pivoting connecting structure and said main body further includes second pivoting connecting structure corresponding to said first pivoting connecting structure of said tray member, said first pivoting connecting structure of said tray member being constructed and arranged to be detachably engagable with said second pivoting connecting structure of said main body so as to permit said tray member to pivot with respect to said main body and with respect to said lid member to a deployed position in which the other of said first and second supporting surfaces is presented when said first pivoting connecting structure is engaged with said second pivoting connecting structure.

4. The container of claim 1, further comprising:

an electrically powered temperature maintaining apparatus constructed and arranged to selectively warm or cool said product receiving compartment, said electrically powered temperature maintaining apparatus including a power cord for connecting said electrically powered temperature maintaining apparatus to an electric power source; and a handle member coupled with at least one of said main body and said lid member and constructed and arranged to permit said container to be carried by said handle member, said handle member including cord stowing structure fixed thereto and constructed and arranged to permit said power cord to be wrapped therearound and to support said wrapped power cord thereon.

5. The container of claim 1, further comprising:

a handle member having two leg portions and a transverse portion extending between respective first ends of said leg portions, said handle member being coupled at respective second ends of said two leg portions with two of said sidewalls of said main body so as to be movable between (1) an operative position that permits said container to be carried by said handle member and (2) a stowed position; and lid clearance structure associated with said one sidewall of said main body, said lid clearance structure constructed and arranged to provide a clearance between an edge of said lid member and a surface on which said container is supported when said container is resting on said surface on said one sidewall to permit said lid member to move freely between said opened position and said closed position in said generally lateral direction without said edge of said lid member scraping said surface on which said container is supported, said lid clearance structure including at least one raised rib formed on an outer surface of said one sidewall.

6. The container of claim 5 wherein said transverse portion of said handle member is disposed along an outer surface of said one sidewall when said handle member is in said stowed position and wherein said lid clearance structure includes said transverse portion of said handle member disposed along said outer surface of said one sidewall.

7. The container of claim 1 wherein:

said base wall, said four sidewalls, and said lid member disposed in said closed position define a width, a length, and a height of said container, an aspect ratio of said height to said length and an aspect ratio of said height to said width being less than 1 to permit said container to sit in a stable position on the automobile seat and to permit said container to be used on the automobile seat without obstructing movement or vision of occupants of the automobile.

8. The container of claim 1, further comprising:

a thermoelectric engine constructed and arranged to selectively cool or warm said product receiving compartment mounted to said main body adjacent top edges of three of said four sidewalls, said thermoelectric engine constructed and arranged to permit said thermoelectric engine unit to be attached to and removed from said main body as an integral modular unit to facilitate assembly or repair of said thermoelectric engine.

9. The container of claim 8, said thermoelectric engine comprising:

component mounting structure constructed and arranged to permit a plurality of components of said thermoelectric engine to be mounted thereon;

a first fan;

a first heat sink disposed adjacent said first fan;

a first fan cover mounted to said component mounting structure and defining a housing around said first fan and a plenum around said first heat sink, said first fan, said first heat sink, and said first fan cover being disposed on a first half of said thermoelectric engine unit;

a second fan;

a second heat sink disposed adjacent said second fan;

a second fan cover mounted to said component mounting structure defining a housing around said second fan and a plenum around said second heat sink, said second fan, said second heat sink, and said second fan cover being disposed on a second half of said thermoelectric engine unit opposite said first half;

a fan motor mounted to said component mounting structure and operatively coupled with said first and second fans; and a thermoelectric module disposed between and in thermal contact with said first and second heat sinks.

10. The container of claim 9, wherein at least one of said first and second heat sinks comprises:

a flat base; and a plurality of mutually parallel longitudinal fins extending from said flat base, each of said plurality of longitudinal fins having an intake end disposed proximate the respective fan and a discharge end further removed from the respective fan compared to said intake end, wherein respective intake ends of substantially all of said plurality of longitudinal fins are disposed along a first transverse end line and wherein said first transverse end line is generally non-perpendicular with respect to said plurality of longitudinal fins.

11. The container of claim 10 wherein said first transverse end line is straight and is disposed at an oblique angle with respect to said plurality of longitudinal fins.

12. The container of claim 10 wherein said first transverse end line is curved.

13. The container of claim 1 wherein said lid member defines a generally planar structure and said tray member defines a generally planar structure, said lid member and said tray member being disposed in a side-by-side, generally parallel orientation when said tray member is in said stowed position so that said lid member and said tray member together define a generally planar door assembly.

14. The container of claim 1 wherein said lid member is pivotally connected to said main body so as to be pivotable with respect to said main body about a lid pivot axis and said tray member is pivotally connected to said main body so as to be pivotable with respect to said main body about a tray pivot axis.

15. The container of claim 14 wherein said lid pivot axis is spaced from and generally parallel to said tray pivot axis.

16. The container of claim 1 wherein said tray member is constructed and arranged to be removable from both said main body and said lid member.

17. The container of claim 2 wherein said tray member is constructed and arranged to be movable between (1) a stowed position wherein said tray member is detachably secured to and movable with said lid member between said closed position and said opened position and (2) a deployed position wherein said tray member is engaged with said main body to present the other of said first and second supporting surfaces and said lid member is movable between said opened position and said closed position independently of said tray member.

18. The container of claim 4 wherein said handle member includes an elongated portion and said cord stowing structure comprises two longitudinally spaced transverse rib members extending from said elongated portion of said handle member and a longitudinal portion attached to distal ends of said transverse rib members and extending generally longitudinally with respect to said elongated portion, said two transverse rib member providing structure for wrapping the cord therearound between said elongated portion of said handle member and said longitudinal portion of said stowing structure.

19. The container of claim 4, said handle member having two leg portions and a transverse portion extending between respective first ends of said two leg portions, said handle member being coupled at respective second ends of said two leg portions with two of said four sidewalls of said main body so as to be movable between (1) an operative position that permits said container to be carried by said handle member and (2) a stowed position, and said cord stowing structure comprising two transverse rib members extending from and spaced longitudinally with respect to one of said two leg portions of said handle member and a longitudinal portion attached to distal ends of said transverse rib members and extending generally longitudinally with respect to said one leg portion, said two transverse rib member providing structure for wrapping the cord therearound between said one leg portion of said handle member and said longitudinal portion of said stowing structure.

20. The container of claim 5 wherein said lid clearance structure includes one or more raised ribs provided on said one sidewall.

21. The container of claim 5 wherein said one side wall has an elongated recess formed along an outer edge thereof opposite said base wall and said end walls have elongate recesses formed along outer edges thereof opposite said base wall and extending from said elongated recess formed on said one side wall generally to a location at which said respective second ends of said two leg portions of said handle member are coupled with said end walls, said elongated recesses formed on said one side wall and said end walls defining a handle stowing recess in which said handle member is stowed when in said stowed position.

22. The heat sink of claim 9 wherein said oblique angle is 15 degrees.

23. The heat sink of claim 8 wherein said respective discharge ends of substantially all of said plurality of longitudinal fins are disposed along a second transverse end line and wherein said second transverse end line is generally non-perpendicular with respect to said plurality of longitudinal fins.

24. The heat sink of claim 23 wherein said first transverse end line and said second transverse end line are straight lines oriented in a generally parallel relationship and are disposed at an oblique angle with respect to said plurality of longitudinal fins.

* * * * *